US010928446B2

(12) United States Patent
Krishna et al.

(10) Patent No.: US 10,928,446 B2
(45) Date of Patent: Feb. 23, 2021

(54) WATCHDOG BUILT IN TEST (BIT) CIRCUIT FOR FAST SYSTEM READINESS

(71) Applicant: Hamilton Sundstrand Corporation, Charlotte, NC (US)

(72) Inventors: Rajeeva Gopala Krishna, Karnataka (IN); Ashish Vijay, Rajasthan (IN); Sesh Mohan Rao, Karnataka (IN)

(73) Assignee: HAMILTON SUNSTRAND CORPORATION, Charlotte, NC (US)

( * ) Notice: Subject to any disclaimer, the term of this patent is extended or adjusted under 35 U.S.C. 154(b) by 74 days.

(21) Appl. No.: 16/261,648

(22) Filed: Jan. 30, 2019

(65) Prior Publication Data

US 2020/0225285 A1   Jul. 16, 2020

(30) Foreign Application Priority Data

Dec. 5, 2018  (IN) .............................. 201811045972

(51) Int. Cl.

| G06F 11/07 | (2006.01) |
| G01R 31/317 | (2006.01) |
| G01R 31/3177 | (2006.01) |
| H03K 19/20 | (2006.01) |

(52) U.S. Cl.
CPC ... *G01R 31/31724* (2013.01); *G01R 31/3177* (2013.01); *G01R 31/31727* (2013.01); *H03K 19/20* (2013.01)

(58) Field of Classification Search
CPC ........ G01R 31/31724; G01R 31/31727; G01R 31/3177; H03K 19/20; G06F 11/0757; G06F 11/2215

USPC ........................................................ 714/733
See application file for complete search history.

(56) References Cited

U.S. PATENT DOCUMENTS

| 4,956,842 A * | 9/1990 | Said .................... G06F 11/2215 |
| | | 714/41 |
| 5,522,040 A | 5/1996 | Hofsäss et al. |
| 6,260,162 B1 | 7/2001 | Typaldos et al. |
| 6,385,274 B1 | 5/2002 | Nohara |

(Continued)

OTHER PUBLICATIONS

Anonymous, "Reduced Test Time for a Watchdog In-Application Timeout and Reset Test", Nov. 8, 2017, IP.com Prior Art Database Technical Disclosure, IP.com No. IPCOM000160240D (Year: 2017).*

(Continued)

*Primary Examiner* — Albert Decady
*Assistant Examiner* — Enam Ahmed
(74) *Attorney, Agent, or Firm* — Cantor Colburn LLP

(57) ABSTRACT

A method of performing a built in test on a watchdog circuit including a watchdog timer includes: initiating the built in test with a processor being monitored by the watchdog circuit, wherein initiating includes enabling a watchdog circuit built in test reset inhibit circuit (WD BIT reset inhibit circuit) connected between an output of an active watchdog integrated reset circuit connected to the processor and a reset input of the processor; and ceasing to provide a strobe signal to the active watchdog integrated reset circuit that resets a watchdog counter in the active watchdog integrated reset circuit, the active watchdog integrated reset circuit causing a reset of the processor via its output when the watchdog counter expires by providing a signal to a reset input of the processor.

18 Claims, 1 Drawing Sheet

(56) References Cited

U.S. PATENT DOCUMENTS

| | | | |
|---|---|---|---|
| 6,654,905 B1 * | 11/2003 | Dickens | G06F 11/0757 |
| | | | 714/10 |
| 7,340,596 B1 * | 3/2008 | Crosland | G06F 1/24 |
| | | | 713/100 |
| 10,089,164 B2 | 10/2018 | Curtis | |
| 2007/0101205 A1 * | 5/2007 | Purrington | G06F 11/0757 |
| | | | 714/55 |
| 2014/0365839 A1 * | 12/2014 | Iwagami | G01R 31/318544 |
| | | | 714/727 |
| 2017/0308441 A1 * | 10/2017 | Dickey | H03K 19/007 |

OTHER PUBLICATIONS

European Search Report for Application No. 19213412.0, dated May 4, 2020, 28 pages.

* cited by examiner

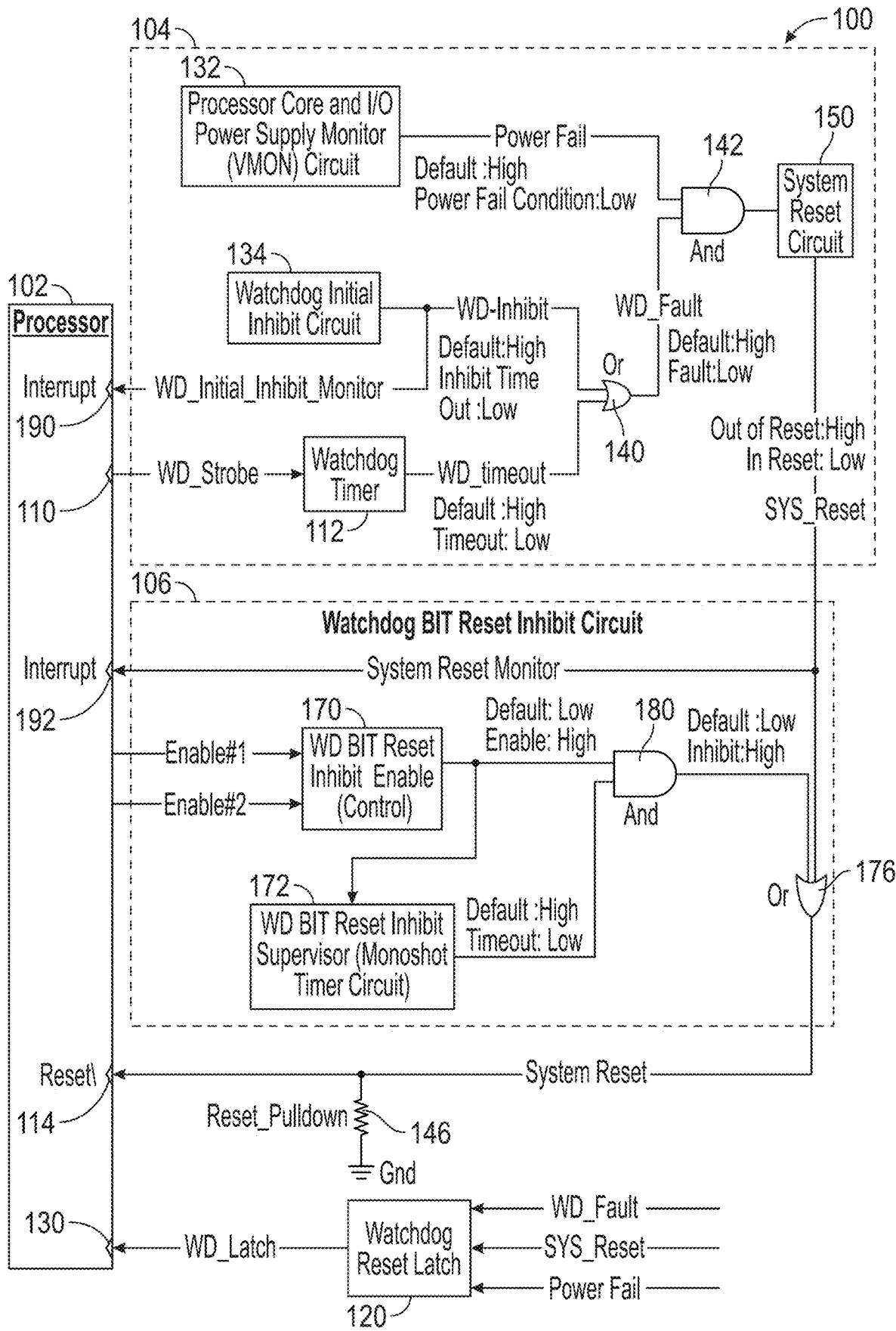

000# WATCHDOG BUILT IN TEST (BIT) CIRCUIT FOR FAST SYSTEM READINESS

FOREIGN PRIORITY

This application claims priority to Indian Patent Application No. 201811045972 filed Dec. 5, 2018, the entire contents of which is incorporated herein by reference.

BACKGROUND

Exemplary embodiments pertain to the art of watchdog circuits and, in particular, to operations during a built in test for a watchdog circuit.

Watchdog circuits are often provided in embedded systems to ensure proper operation of a processor in the system. For instance, when the systems include a processor that runs software, a watchdog circuit can cause a reset/reboot of the processor in the event of a software hang condition. In aerospace application for higher reliability and mitigation over Single Event Effect generally the watchdog circuit will be implemented using external piece of hardware rather than using a processor internal watchdog module.

In critical aerospace applications it is mandatory to incorporate diagnostic tests in embedded systems to check the health of hardware circuitry which are identified to be critical for system functionality. These diagnostic tests can be termed as a built in test (BIT) as these diagnostic tests are developed to be self-reliant with additional hardware circuitry or software. Depending on the complexity and criticality of the hardware or interface the BITs are executed periodically or once during power-on. The criticality of the BIT circuit for the watchdog function is that, it should be able to provide diagnostics without disrupting the normal operation of the watchdog and reset circuit and should not provide false reset conditions. Also, the BIT time should not be significantly high that it impacts the total system readiness time.

BRIEF DESCRIPTION

Disclosed is a watchdog circuit for an aerospace processor. The circuit includes an active watchdog integrated reset circuit connected to the processor that receives a strobe signal from the processor and that includes a watchdog counter that is reset by the strobe. The active watchdog integrated reset circuit causes a reset of the processor when the watchdog counter expires by providing a signal to a reset input of the processor. The circuit also includes a watchdog circuit built in test reset inhibit circuit (WD BIT reset inhibit circuit) connected between an output of the active watchdog integrated reset circuit and the reset input of the processor. The WD BIT reset inhibit circuit prevents the active watchdog integrated reset circuit from resetting of the processer for a predetermined time after the processor initiates a built in test of the active watchdog integrated reset circuit.

In one embodiment of any above disclosed watchdog circuit, the strobe signal is provided during a serial software execution of software on operating on the processor.

In one embodiment of any above disclosed watchdog circuit, the WD BIT reset inhibit circuit includes a control block connected to the processor that receives one or more enable signals from the processor that enable operation of the inhibit circuit.

In one embodiment of any above disclosed watchdog circuit, the one or more enable signals includes two enable signals from the processor and enables operation of the WD BIT reset inhibit circuit when the two signals are provided in predetermined manner.

In one embodiment of any above disclosed watchdog circuit, the WD BIT reset inhibit circuit includes a supervisor block that includes supervisor block timer having an normally high output that goes low when the supervisor block timer expires. In this embodiment, the control block includes a normally low output connected to an input to the supervisor block timer, the control block providing a high signal to the supervisor block timer when the one or more enable signals are received that causes the control block timer to start counting.

In one embodiment of any above disclosed watchdog circuit, when the output of the control block and the supervisor block timer are both high, the WD BIT reset inhibit circuit prevents the active watchdog integrated reset circuit from the resetting the processor.

In one embodiment of any above disclosed watchdog circuit, the inhibit circuit includes an AND gate having one input connected to the output of the control block and another connected to the output of the supervisor block timer.

In one embodiment of any above disclosed watchdog circuit, the supervisor block timer operates for a time equal to or greater than the sum of two times a watchdog timer and a system reset time ($T_{boot}$).

In one embodiment of any above disclosed watchdog circuit, the active watchdog integrated reset circuit includes a system reset circuit that includes a system reset (SYS_RESET) output that is low when the watchdog timer expires.

In one embodiment of any above disclosed watchdog circuit, the inhibit circuit includes an OR gate and wherein the inhibit provides a high signal to one input of the OR when while the supervisor block is enabled and the supervisor block timer is operating and the SYS_RESET output is coupled to another of the OR gate.

In one embodiment of any above disclosed watchdog circuit, the circuit further includes a reset pull down resistor connected between an output of the OR gate and ground. In this embodiment, the output of the OR gate is connected to the reset input of the processor and the processor is reset when a low signal is received at the reset input.

In one embodiment of any above disclosed watchdog circuit, when the processor begins built in test of the active watchdog integrated reset circuit it monitors the SYS_RESET output and records one or more of a status of a watchdog initial inhibit timer and an indication of a watchdog initiated reset.

In one embodiment of any above disclosed watchdog circuit, the circuit further includes a watchdog reset latch that stores the indication of a watchdog initiated reset, the SYS_RESET output and the status of the watchdog initial inhibit timer when the processor initiates the built in test of the active watchdog integrated reset circuit.

Also disclosed is a method of performing a built in test on a watchdog circuit including a watchdog timer. The method includes: initiating the built in test with a processor being monitored by the watchdog circuit, wherein initiating includes enabling a watchdog circuit built in test reset inhibit circuit (WD BIT reset inhibit circuit) connected between an output of an active watchdog integrated reset circuit connected to the processor and a reset input of the processor; and ceasing to provide a strobe signal to the active watchdog integrated reset circuit that resets a watchdog counter in the active watchdog integrated reset circuit, the active watchdog integrated reset circuit causing a reset of the processor via its output when the watchdog counter expires by providing a signal to a reset input of the processor.

In one embodiment of any above disclosed method, when enabling the WD BIT reset inhibit circuit causes a supervisor block timer to start and the WD BIT reset inhibit circuit prevents the output of the active watchdog integrated reset circuit from resetting the processor while the supervisor block timer is running.

In one embodiment of any above disclosed method, the WD BIT reset inhibit circuit includes a control block connected to the processor that receives one or more enable signals from the processor that enable operation of the WD BIT reset inhibit circuit.

In one embodiment of any above disclosed method, the supervisor block timer operates for a time equal to or greater than the sum of two times a watchdog timer time and a system reset time ($T_{boot}$).

In one embodiment of any above disclosed method, when processor begins the built in test it monitors the output of the active watchdog integrated reset circuit and records one or more of a status of the watchdog timer and a power fail indication.

BRIEF DESCRIPTION OF THE DRAWING

The following descriptions should not be considered limiting in any way. With reference to the accompanying drawing, like elements are numbered alike:

FIG. 1 is a schematic of a watchdog system that includes watchdog circuit built in test reset inhibit circuit.

DETAILED DESCRIPTION

A detailed description of one or more embodiments of the disclosed apparatus and method are presented herein by way of exemplification and not limitation with reference to the Figures.

With reference to FIG. 1, a watchdog system 100 according to one embodiment is disclosed. The system 100 includes a processor 102. The system includes an active watchdog integrated reset circuit 104 connected to the processor 102 and a watchdog circuit built in test reset inhibit circuit 106 (WD BIT reset inhibit circuit) coupled between the two. In one embodiment, the active watchdog integrated reset circuit 104 causes a reset of the processor when a watchdog counter expires after not receiving a strobe signal from the processor for a pre-determined time. As more fully described below, WD BIT reset inhibit circuit 106 prevents the active watchdog integrated reset circuit from causing the reset of the processer for a predetermined time after the processor initiates a built in test of the active watchdog integrated reset circuit.

The active watchdog integrated reset circuit 104 shown in FIG. 1 is an example and not meant to be limiting. Herein, an active watchdog integrated reset circuit can be any circuit that receives a strobe signal from the processor 100 and if there is a delay between strobe signals that a timer or counter period causes a reset of the processor 100.

The particular active watchdog integrated reset circuit 104 shown in FIG. 1 receives a strobe signal (WD_Strobe) from a strobe output 110 of the processor 100. This strobe input causes a watchdog timer 112 to be reset. If this timer 112 times out (and other conditions are met) before another strobe signal is received the active watchdog integrated reset circuit 104 causes a reset of the processor 100.

In the example in FIG. 1, the processor 100 includes a reset input 114 (RESET\) that, when it receives a logical "low" signal, will cause a reset of the processor (e.g., when System Reset) is low. Herein, the terms "low" and "high" will be used to refer to various signals. In the context of a digital circuit as shown in FIG. 1 these terms refer, respectively, to a logical "0" (low) and a logical "1" (high). Thus, herein, when a signal or output is described as being "low" it means that it is logical 0 and when "high" it means it is a logical 1.

In more detail, embedded software in the processor periodically restarts the watchdog timer 112 counter by periodic trigger (WD_Strobe) before the timer expires. As software is a serial execution setup, during a software malfunction or hang condition the software cannot periodically cause the strobe output 110 to provide WD_Strobe. This allows the watchdog timer 112 to reach a predetermined time (or to count down from a predetermined counter level) and leads to a reset of the processor 100. Such operation can allow the processor 100 to be self-reliant in handling software hangs or malfunction condition.

As discussed above, it may be required to support a BIT for the active watchdog integrated reset circuit 104. To that end, a hardware latch 120 (also referred to as a watchdog reset latch) is provided that latches once watchdog timer expires (e.g., SYS_Reset goes low as described below) and remains latched until system power-off (e.g., Power_Fail goes low). In more detail, the watchdog reset latch 120, to support the watchdog built in test, is used to identify system reset due to an injected failure part of watchdog circuit built-in test or a genuine power failure, which stores the watchdog reset information with correct cause of the reset. The watchdog reset latch 120 latches its output for the first watchdog fault initiated system-reset (WD_Fault). It remains latched for any number of watchdog reset and clears for system power-off or system-reset initiated due to processor power fail fault (Power Fail). During watchdog circuit built in test, software uses latch output to verify the watchdog circuit functionality.

Stated slightly differently, during watchdog circuit built-in-test, software in the processor 100 stops triggering the watchdog circuit (e.g., no output is provided at strobe output 110). Prior to stopping the strobe output 110, the software in the processor 100 records the initiation of the watchdog test and watchdog fault latch value (WD_latch) received at latch input 130. The missed triggering of the watchdog circuit timer 112 causes the output thereof (WD_timeout) to go to a low value and this results in a resetting of the processor 100 and sets the watchdog fault latch 120.

After the reset, the processor 100 reboots and verifies the stored initiation of watchdog test and watchdog fault latch data to check the success of the watchdog circuit built-in-test. For a successful test, the WD_Fault is driven to a desired level and the latch 120 is released.

For sake of completeness, other elements of the active watchdog integrated reset circuit 104 are now described. In particular, as shown, the active watchdog integrated reset circuit 104 includes a power supply monitor 132. In operation, the processor 100 should be put into reset well before the processor core and I/O power supply goes out of operating range. This power supply monitor 132 detects the processor core and I/O power supply rails are out of operating voltage range condition and drives the system reset. The output (Power Fail) of the power monitor 132 is normally high and, when an error condition is detected, that signal is low.

The illustrated active watchdog integrated reset circuit 104 also includes watchdog initial inhibition circuit 134. This circuit inhibits the watchdog circuit fault (WD_Fault)

that would be generated initially until the processor boots and drives watchdog strobe (WD_Strobe) during system power on or watchdog initiated system-reset. The watchdog initial inhibit circuit 134 can be a timer that outputs a high value during an inhibition time (WD_Inhibit) during a time equal to time taken by processor to boot and begin to drive the first watchdog strobe (WD_Strobe). The processor 100 needs to monitor this circuit output (WD_Initial Inhibit Monitor) to initiate the watchdog circuit built-in-test. During inhibition, this signal is driven high.

The output of the watchdog initial inhibition circuit 134 and the watchdog timer 112 are provided to an OR gate 140. The output of the OR gate 140 (WD_Fault) is "anded" with the output of the power supply monitor 132 at AND gate 142. The output of AND gate 142 is provided to a system reset circuit 150.

In general the system-reset circuit 150 drives an active low signal (SYS_Reset) on its output which interfaces with processor reset input 114 in response to its input processor power rail fault (out of range; Power fail goes low) and watchdog circuit fault (WD_Fault) goes low. If either occurs the output of AND gate 142 goes low. As will be understood by the skilled artisan from FIG. 1, when SYS_Reset goes low (and WD BIT reset inhibit circuit 106 is inactive) System Reset is driven low and causes a processor reset. The normally high signal may be coupled to ground via a reset pulldown resistor 146.

In more detail, during operation the system reset circuit 150 takes care of processor reset signal setup time and hold time for both power-on and power-down condition. In the proposed architecture the system reset signal output (SYS_RESET) is additionally monitored by the processor (System Reset Monitor) on any GPIO/Interrupt to verify the watchdog fault initiated system-reset during watchdog built in test condition.

In a system as described above and without WD BIT reset inhibit circuit 106, the total system readiness time from power on includes the time that required for all necessary power rails to reach its stable state (Tpower), reset-out time (Treset), processor boot time ($T_{Boot}$) and the time for the BIT ($T_{BITtest}$) and repeated reset-out-time and processor reboot time due to watchdog circuit BIT shown in equation 1 below:

$$T_{total\_system\ ready} = T_{power} + 2*T_{reset} + 2*T_{boot} + T_{BIT\ test} \quad (1)$$

The longest of these times is the processor boot time ($T_{boot}$) and it repeats two times. Hence the repeated processor reboot time due to watchdog built-in-test test will become very crucial where the system readiness time is very critical. This necessitates having a watchdog circuit architecture that inhibits the reset during the watchdog circuit built-in test. To that end, the system includes a watchdog circuit built in test inhibit circuit 106 connected between and output of the active watchdog integrated reset circuit (SYS_Reset) and the reset input 114 of the processor. In one embodiment, WD BIT reset inhibit circuit 106 prevents the active watchdog integrated reset circuit 104 from causing a reset of the processer 100 for a predetermined time after the processor 100 initiates a built in test of the active watchdog integrated reset circuit 104.

The WD BIT reset inhibit circuit 106 includes a control block 170 that can receive either one or two enable signals (enable 1 and enable 2) from the processor 100 when WD BIT is initiated and enable the WD BIT reset inhibit circuit 106. For example, consider first a system that only includes enable 1. In such a system, when enable 1 is provided, the control block 170 enables the system (output a high value) and starts a supervisor block control circuit 172 (also referred to supervisor block timer and can be a mono-shot timer in one embodiment). In another instance, a particular configuration of two signals (enable 1, enable 2) may be provided that causes the control block 170 to enable the WD BIT reset inhibit circuit 106 and starts the supervisor block timer 172.

The supervisor block timer 172 outputs a high value while operating. When both the output of the supervisor block timer 172 and the output of the control circuit 170 are "high" (e.g., output of AND gate 180 is high) the SYS_Reset is prevented from reaching the reset input 114. This can be accomplished by providing the output of AND gate 180 and SYS_RESET to the input of a disable OR gate 176. This will keep System Reset high during the watchdog circuit BIT and serves to eliminate one of the boot times ($T_{boot}$) in equation 1 above. In one embodiment, the supervisor block timer 172 is set to a time that is equal to the sum of two times the watchdog timer 112 time, a system reset time (Tboot) and a processing time of the latch 120. State differently, the supervisor block timer 172 can be set to a time equal to or greater than the sum of two times a watchdog timer time and a system reset time (Tboot).

In more detail, software in the processor 100 decides the watchdog built-in-test schedule as part of its hardware health monitoring test sequence. Prior to initiation of watchdog built-in-test, software needs to verify the status of a watchdog fault inhibit signal (WD_initial inhibit monitor) at input 190, system-reset (SYS_RESET) at input 192 and the watchdog latch at input 130. The WD_initial inhibit monitor indicates to the software the completion of the initial inhibit time and correctness of the watchdog circuit. The system-reset signal SYS_RESET and WD latch status signal monitor is to verify and record signals inactive state for next processing.

To begin a watchdog built-in-test, the software stops periodic watchdog timer circuit strobe (WD_STROBE) and drives one or both of the discrete enable signals (enable 1, enable 2) to enable watchdog built-in-test system reset inhibit time (e.g., to enable the inhibit circuit 106 to override SYS_Reset after timeout of the watchdog timer 112). In particular, after the watchdog timer 112 expires, as the periodic watchdog strobe is missing, the watchdog fault initiated system-reset is generated and the watchdog latch is set. As the SYS-RESET is inhibited, the software senses that signal at input 192 as well watchdog latch signal (input 130) and compares status with status sensed prior to the watchdog built-in-test. The software declares successful completion of watchdog-built-in test by monitoring the changed signal status of the SYS_RESET and WD_LATCH and starts periodic strobe to watchdog circuit. As such, the disclosed system avoids the processor reset for the watchdog built-in-test.

The skilled artisan will realize that by employing this system/method, during system power on condition the successful processor boot indicates the functional correctness of the reset circuit and processor reset input 114. Hence inhibiting the system reset and monitoring only the system reset in the proposed architecture won't lower the watchdog circuit BIT coverage. Also the proposed architecture ensures the correctness of the watchdog circuit functionality without system reboot and may be useful where the system readiness time is very critical.

In addition to the above benefits the proposed architecture provides the following benefits: as the proposed architecture inhibits the system reset, watchdog circuit built-in-test can be executed in Continuous built-in-test (C-BIT); the WD BIT reset inhibit circuit 106 may mitigate continuous inhibition of system-reset by software using two discrete enable signals due to software malfunction. Further, the two enable signals can lowers the probability of false triggering of WD BIT reset inhibition function.

Based on the disclosure herein the proposed architecture has system-reset inhibition supervisor implemented in hardware and system-reset inhibition enable and system-reset monitor implemented in software. Hence the combination of "hardware supervisor" and "software control and monitor" architecture provides functional independence and even though software malfunctions during BIT, the supervisor circuit will be able to disable the system-reset inhibit after a predefined time for any inadvertent enabling and continuous system reset inhibition. Further, proposed watchdog circuit architecture implementation will able to detect the watchdog circuitry component failure during Power On BIT (PBIT) time. As the processor boots, during to system power on, the WD BIT covers the functional testing of processor reset pin; inhibiting the system reset and monitoring system reset signal in the proposed architecture will not lower the BIT coverage The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A watchdog circuit for an aerospace processor, the watchdog circuit comprising:
an active watchdog integrated reset circuit connected to the processor that receives a strobe signal from the processor, the active watchdog integrated reset circuit including a watchdog counter that is reset by the strobe, the active watchdog integrated reset circuit causing a reset of the processor when the watchdog counter expires by providing a signal to a reset input of the processor; and
a watchdog circuit built in test reset inhibit circuit (WD BIT reset inhibit circuit) connected between an output of the active watchdog integrated reset circuit and the reset input of the processor, WD BIT reset inhibit circuit preventing the active watchdog integrated reset circuit from resetting of the processer for a predetermined time after the processor initiates a built in test of the active watchdog integrated reset circuit.

2. The watchdog circuit of claim 1, wherein the strobe signal is provided during a serial software execution of software operating on the processor.

3. The watchdog circuit of claim 1, wherein the WD BIT reset inhibit circuit includes a control block connected to the processor that receives one or more enable signals from the processor that enable operation of the inhibit circuit.

4. The watchdog circuit of claim 3, wherein the one or more enable signals includes two enable signals from the processor and enables operation of the WD BIT reset inhibit circuit when the two signals are provided in predetermined manner.

5. The watchdog signal of claim 3, wherein the WD BIT reset inhibit circuit includes a supervisor block that includes a supervisor block timer having an normally high output that goes low when the supervisor block timer expires;
wherein the control block includes a control block timer and a normally low output connected to an input to the supervisor block timer, the control block providing a high signal to the supervisor block timer when the one or more enable signals are received that causes the control block timer to start counting.

6. The watchdog circuit of claim 5, wherein when the output of the control block and the supervisor block timer are both high, the WD BIT reset inhibit circuit prevents the active watchdog integrated reset circuit from the resetting the processor.

7. The watchdog circuit of claim 6, wherein the inhibit circuit includes an AND gate having one input connected to the output of the control block and another connected to the output of the supervisor block timer.

8. The watchdog circuit of claim 7, wherein the supervisor block timer operates for a time equal to or greater than the sum of two times a watchdog timer and a system reset time ($T_{boot}$).

9. The watchdog circuit of claim 8, wherein the active watchdog integrated reset circuit includes a system reset circuit that includes a system reset (SYS_RESET) output that is low when the watchdog timer expires.

10. The watchdog circuit of claim 9, wherein the inhibit circuit includes an OR gate and wherein the inhibit circuit provides a high signal to one input of the OR gate while both the supervisor block is enabled and the supervisor block timer is operating;
wherein the SYS_RESET output is coupled to another input of the OR gate.

11. The watchdog circuit of claim 10, further comprising:
a reset pull down resistor connected between an output of the OR gate and ground;
wherein the output of the OR gate is connected to the reset input of the processor and the processor is reset when a low signal is received at the reset input.

12. The watchdog circuit of claim 9, wherein when the processor begins the built in test of the active watchdog integrated reset circuit it monitors the SYS_RESET output and records one or more of a status of a watchdog initial inhibit timer and an indication of a watchdog initiated reset.

13. The watchdog circuit of claim 12, further comprising:
a watchdog reset latch that stores the indication of a watchdog initiated reset, the SYS_RESET output and the status of the watchdog initial inhibit timer when the processor initiates the built in test of the active watchdog integrated reset circuit.

14. A method of performing a built in test on a watchdog circuit including a watchdog timer, the method comprising:
  initiating the built in test with a processor being monitored by the watchdog circuit, wherein initiating includes enabling a watchdog circuit built in test reset inhibit circuit (WD BIT reset inhibit circuit) connected between an output of an active watchdog integrated reset circuit connected to the processor and a reset input of the processor; and
  ceasing to provide a strobe signal to the active watchdog integrated reset circuit that resets a watchdog counter in the active watchdog integrated reset circuit, the active watchdog integrated reset circuit causing a reset of the processor via its output when the watchdog counter expires by providing a signal to the reset input of the processor.

15. The method of claim 14, wherein enabling the WD BIT reset inhibit circuit causes a supervisor block timer to start and the WD BIT reset inhibit circuit prevents the output of the active watchdog integrated reset circuit from resetting the processor while the supervisor block timer is running.

16. The method of claim 15, wherein the WD BIT reset inhibit circuit includes a control block connected to the processor that receives one or more enable signals from the processor that enable operation of the WD BIT reset inhibit circuit.

17. The method of claim 15, wherein the supervisor block timer operates for a time equal to or greater than the sum of two times a watchdog timer time and a system reset time ($T_{boot}$).

18. The method of claim 14, wherein when the processor begins the built in test it monitors the output of the active watchdog integrated reset circuit and records one or more of a status of the watchdog timer and a power fail indication.

* * * * *